United States Patent
Yoo et al.

(10) Patent No.: US 6,661,256 B2
(45) Date of Patent: Dec. 9, 2003

(54) RACE LOGIC CIRCUIT

(75) Inventors: Hoi Jun Yoo, Taejon (KR); Se Joong Lee, Taejon (KR)

(73) Assignee: Korea Advanced Institute of Science and Technology (KR)

( * ) Notice: Subject to any disclaimer, the term of this patent is extended or adjusted under 35 U.S.C. 154(b) by 62 days.

(21) Appl. No.: 10/089,462
(22) PCT Filed: Sep. 19, 2001
(86) PCT No.: PCT/KR01/10573
  § 371 (c)(1),
  (2), (4) Date: Mar. 29, 2002

(65) Prior Publication Data
  US 2002/0163362 A1 Nov. 7, 2002

(51) Int. Cl.$^7$ .................... H03K 19/00; H03K 5/22
(52) U.S. Cl. .................... 326/93; 326/82; 326/104; 327/58
(58) Field of Search .................... 326/93, 95, 62, 326/82, 104; 327/58, 69

(56) References Cited

U.S. PATENT DOCUMENTS 5,162,674 A  11/1992  Allstot et al. ............... 307/451
5,572,151 A  11/1996  Hanawa et al. ............. 326/113
5,703,503 A  * 12/1997  Miyanoto et al. ............. 327/58
6,118,307 A  * 9/2000  Shi et al. ..................... 327/58

* cited by examiner

Primary Examiner—Daniel Chang
(74) Attorney, Agent, or Firm—Marger Johnson & McCollom, P.C.

(57) ABSTRACT

A race logic circuit of the present invention includes: a WTA circuit for receiving an operand logic signal and outputting only a high signal which is the first to arrive among the operand logic signals; plural race lines for inputting the operand logic signal into the WTA circuit; a clock distribution line having plural delay devices connected in series, both ends of the respective delay devices being connected to a triggering line, the clock distribution line receiving an external clock and outputting a triggering signal into the triggering line; and plural operand logic signal input switches which are triggered by the triggering signal output from the triggering line, for deciding whether to input the operand logic signal into the race line. According to the race logic of the present invention makes it possible to compose various logic circuits. Especially, when realizing the race logic circuit as integrated circuits, time delay due to the transistors can be removed during the logic operation. Further, time delay in the interconnection lines is actively utilized to enhance the system speed.

1 Claim, 5 Drawing Sheets

RACE LOGIC CIRCUIT

TECHNICAL FIELD

The present invention relates to a logic operation algorithm applicable to the execution of a logic operation, and more particularly to a logic operation algorithm in which conventional logic gates are not used and the logic operations are performed using a difference in times taken while operands arrive at a specific circuit.

BACKGROUND ART

FIG. 1 is a block diagram for schematically describing a relationship between the conventional methods for embodying several logic circuits and a race logic circuit of the present invention.

Up to the now, all the digital circuits have used logic devices in order to perform logic operations. These logic devices are realized by integrated circuits (ICs). There are several methods in realizing a single logic device. For instance, there are a static circuit realization method, a dynamic circuit realization method and so on.

Since these respective realization methods have a difference in operation speed, power consumption amount, area occupied in an integrated circuit, etc., they show different performance from each other.

In case of realizing an integrated circuit system, selecting a proper logic circuit realization method allows a system in accordance with a designer's intention to be realized.

In recent years, as various types of logic circuit realization methods are provided, performance of logic devices is enhanced and their characteristics are also diversified.

However, in the use of the logic devices, there are two problems basically. One is a delay time due to the use of transistor. Since logic device uses transistor in order to perform logic operation, time delay generated by the transistor is basically inevitable. Due to the advancement in IC process technologies, there appears a tendency toward decrease in the delay time, but the transistor still has a finite delay time. Such a delay time is inevitable in all logic circuits of performing logic operation.

The other problem is a delay time in interconnection line, which is generated due to the increase in the integrity of the ICs. Increase in the integrity decreases the interval between interconnection lines in ICs, resulting in the increase in the parasitic capacitance that is generated between the interconnection lines. Because of this, the time delay due to the interconnection lines also occupies a considerable portion in a time spent in performing a logic operation.

Due to these problems, if a logic circuit is realized by a logic device composed of transistors, no matter how fast logic circuit realization method is developed, the logic circuit can not be operated in a speed faster than the delay time due to the transistors and the delay time due to the interconnection lines.

DETAILED DESCRIPTION OF THE INVENTION

Accordingly, it is an object of the present invention to develop a logic operation method that is different from the conventional method using a logic device and thus provide a new methodology in the logic operation.

It is another object of the present invention to overcome the delay time problem due to the transistors and the interconnection lines and thus actively use waste of the delay time.

To accomplish the above objects, there is provided a race logic circuit including: a WTA circuit for receiving an operand logic signal and outputting only a high signal which is the first to arrive among the operand logic signals; multiple race lines for inputting the operand logic signal into the WTA circuit; a clock distribution line having multiple delay devices connected in series, both ends of the respective delay devices being connected to a triggering line, the clock distribution line receiving an external clock and outputting a triggering signal into the triggering line; and multiple operand logic signal input switches which are triggered by the triggering signal output from the triggering line, for deciding whether to input the operand logic signal into the race line or not.

BEST MODE FOR CARRYING OUT THE INVENTION

Hereinafter, preferred embodiments of the present invention will be described in detail with reference to the accompanying drawings.

Figure 1:
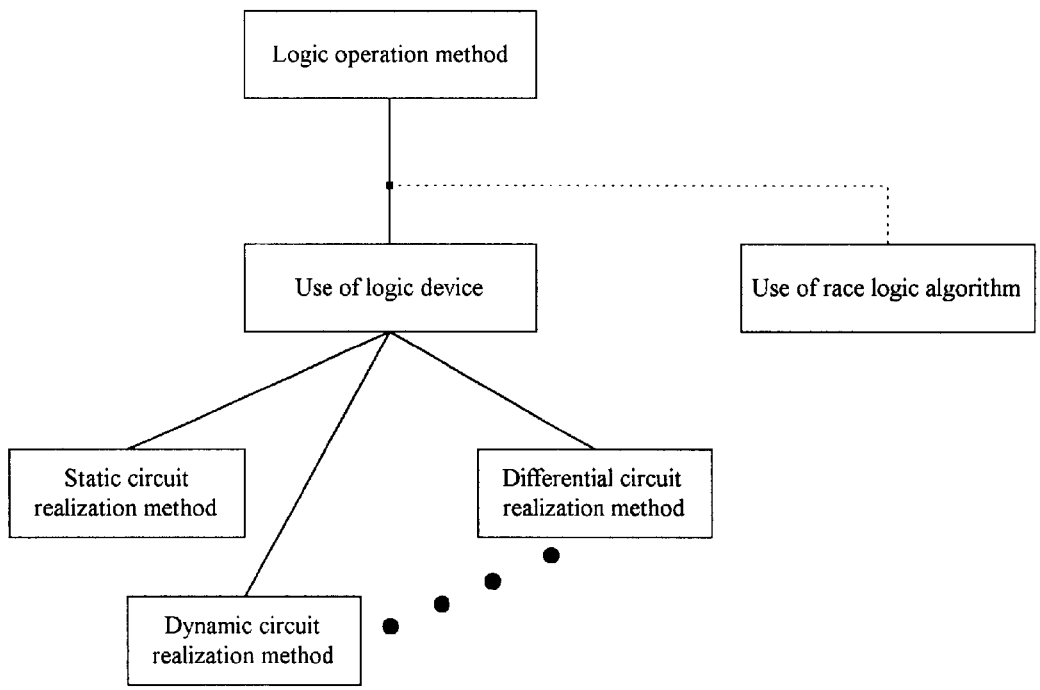
FIG. 1 is a simplified block diagram for describing a relationship between the conventional methods for embodying several logic circuits and a race logic circuit of the present invention.
Figure 2:
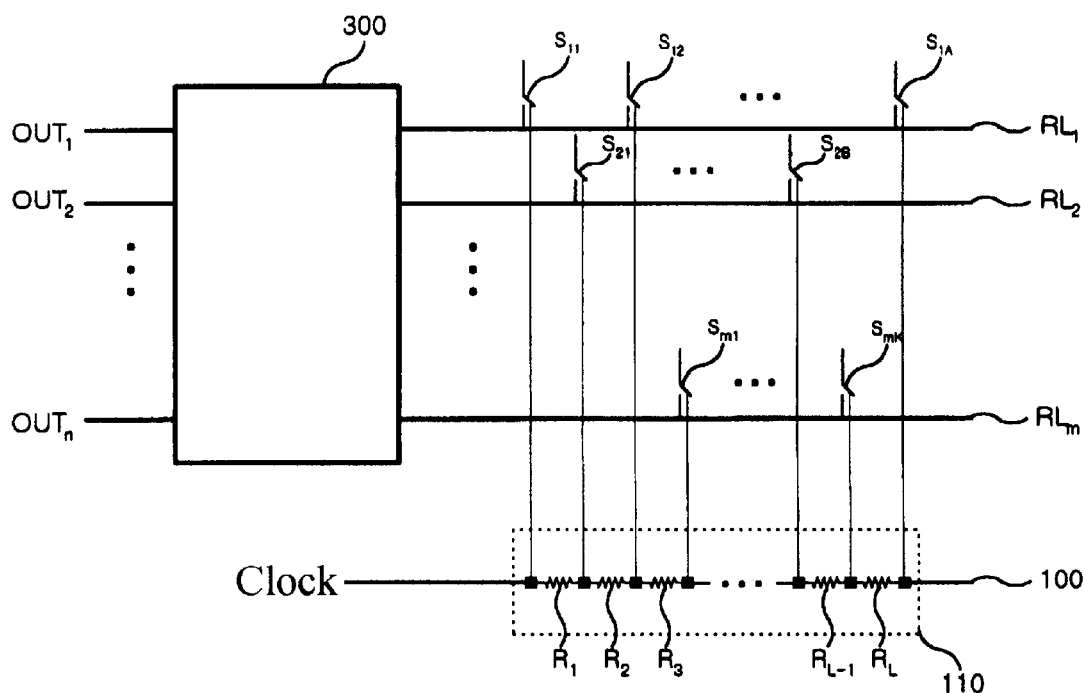
FIG. 2 is a circuit diagram for describing a race logic circuit in accordance with the present invention.

FIG. 2 is a circuit diagram for describing a race logic circuit in accordance with the present invention.

Referring to FIG. 2, a race logic circuit includes a clock distribution line (CDL) 100, multiple race lines $RL_1$ to $RL_m$, and a WTA (Winner-Take-All) circuit 300 for outputting only high signal (H), which is the first to arrive. The CDL 100 includes a resistor array 110 including L numbers of resistors $R_1$ to $R_L$ connected in series.

Hereinafter, like elements are designated by identical reference numerals.

A plurality of operand input switches are electrically connected to the respective race lines. Clock signal input into the CDL 100 is input into the resistor array 110 to trigger the operand input switch $S_{11}$, so that an input signal is input. At this time, if the input signal is H, the input signal is transferred into the WTA circuit 300 through the race line $R_{L1}$. The clock signal passes through the resistance $R_1$ to trigger the operand input switch $S_{21}$ after a constant time delay. Since the input signal input into the operand input switch $S_{11}$ arrives at the WTA circuit 300 first of all regardless of whether the input signals input into the operand input switches, $S_{21}, S_{12}, \ldots, S_{mk}$, are high (H) or low (L), the input signals input into the operand input switches, $S_{21}$, $S_{12}, \ldots, S_{mk}$, do not affect on the output.

On the other hands, in case that the input signal of the operand input switch $S_{11}$ is L, the input signal is neglected and accordingly there is no output from the WTA circuit 300. The clock signal passes through the resistance R1 and it triggers the operand input switch $S_{21}$ after a constant time delay. At this time, in case that the input signal input into the operand input switch $S_{21}$ is H, the input signal is transferred into the WTA circuit 300 through the race line $RL_2$.

Like the above, an input signal by the triggering of other operand input switches, which are triggered after the operand input switch $S_{12}$ has been triggered does not affect on the output.

Next, there is described a method for performing a logic operation using the race logic with two race lines and two outputs of OUT and $\overline{OUT}$.

Figure 3:
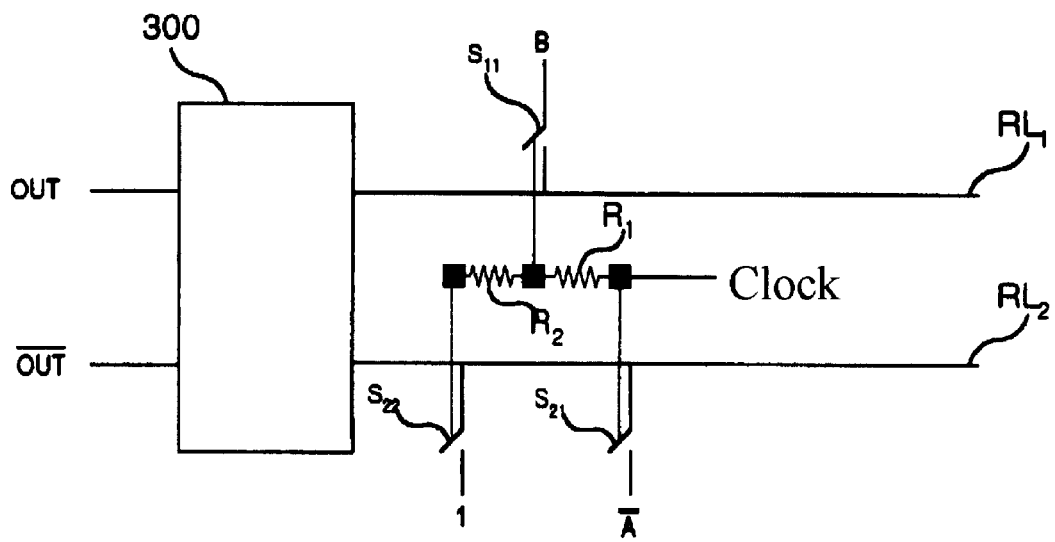
FIG. 3 is a circuit diagram for performing an operation of OUT=AB in accordance with one example of the present invention.

Referring to FIG. 3, a WTA circuit 300 includes two race lines $RL_1$ and $RL_2$ and two outputs of OUT and $\overline{OUT}$. It is defined that the race line $RL_1$ is a true line and the race line $RL_2$ is a false line. The true line and the false line are all in low (L) state. In case that an input signal that is the first to be transferred into the WTA circuit 300 through the true line is high (H), the output of the WTA circuit 300 OUT becomes H while in case that an input signal that is the first to be transferred into the WTA circuit 300 through the false line is high (H), the output of the WTA circuit 300 becomes $\overline{OUT}$.

(1) A is L and B is L or H

As the clock signal is input through the CDL 100, it triggers the operand input switch $S_{21}$. At this time, since the input signal A is L, the race line $RL_2$ becomes H, so that the input signal of the operand input switch $S_{21}$ arrives at the WTA circuit 300 first of all. Accordingly, $\overline{OUT}$ becomes H regardless of value of B. In other words, OUT is maintained at L.

(2) A is H and B is H

Since A is H, the race line $RL_2$ becomes L, so that the output of the WTA circuit 300 becomes different depending on value of B. Accordingly, if the clock signal passes through the resistance $R_1$ and then it triggers the operand input switch $S_{11}$ after a constant time delay, since the input signal B is in high (H) state, the race line $RL_1$ becomes H, so that the output of the WTA circuit 300 becomes H state.

(3) A is H and B is L

Since A is H and B is L, the race lines $RL_1$ and $RL_2$ become L state respectively, so that the output of the WTA circuit 300 depends on an input signal that is input into the operand input switch $S_{22}$ which is being triggered next times. Thus, in case that all inputs are L, termination is needed, so that the termination must be connected to either line of the true line and the false line. In FIG. 3, the termination switch $S_{22}$ is connected to the false line, so that $\overline{OUT}$ becomes H state.

Referring to the above three cases of (1) to (3), when A is L, B is L or H, OUT becomes L, when A is H and B is H, OUT becomes H and when A is H and B is L, OUT becomes L, so that the race logic circuit can obtain the same output as logic product of A AND B.

Figure 4:
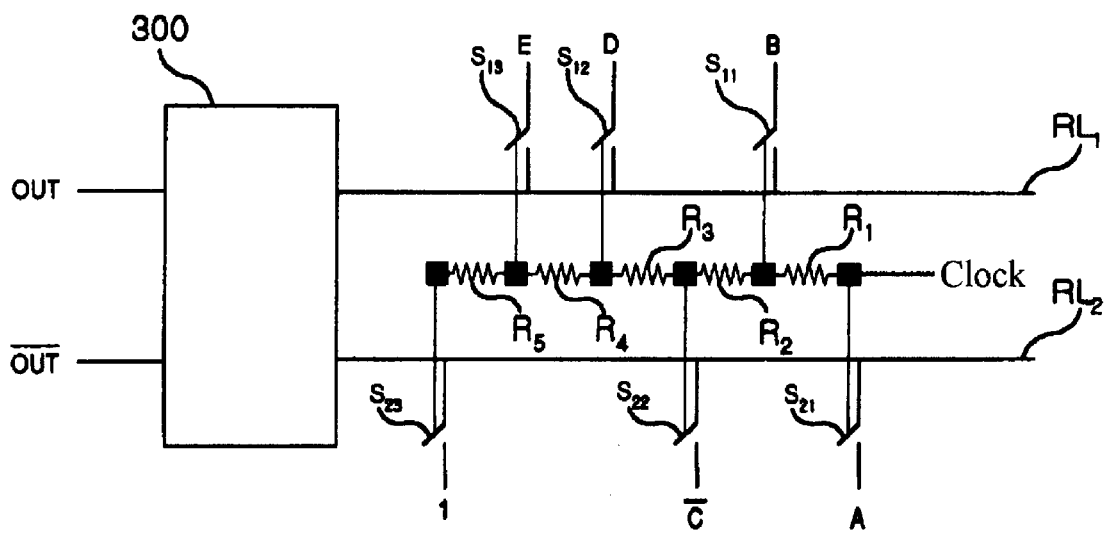
FIG. 4 is a circuit diagram of a race logic circuit for performing a logic operation OUT=$\overline{A}${B+C(D+E)} in accordance with other example of the present invention.

FIG. 4 is a circuit diagram of a race logic circuit for performing a logic operation OUT=$\overline{A}\{B+C(D+E)\}$ in accordance with one embodiment of the present invention.

Referring to FIG. 4, a race logic circuit includes two race lines $RL_1$ and $RL_2$ and two outputs of OUT and $\overline{OUT}$. The race line $RL_1$ that is a true line is connected to operand input switches $S_{11}$, $S_{12}$ and $S_{13}$ and the race line $RL_2$ that is a false line is connected to operand input switches $S_{21}$, $S_{22}$ and $S_{23}$. The race lines $RL_1$ and $RL_2$ are also connected to the WTA circuit 300 respectively. The WTA circuit 300 has two outputs of OUT and $\overline{OUT}$.

Hereinafter, there is specifically described a logic operation procedure of the race logic circuit shown in FIG. 4.

(1) A is H

As a clock signal is input, the operand input switch $S_{21}$ is triggered first of all, so that the race line $RL_2$ becomes H first of all. Accordingly, the output of the WTA circuit 300, OUT becomes L regardless of values of B, C, D and E.

(2) A is L and B is H

As clock signal is input, the operand input switch $S_{11}$, is triggered, so that the race line $RL_1$ becomes H first of all. Accordingly, the output of the WTA circuit 300, OUT becomes H regardless of values of C, D and E.

(3) A, B and C are all L

Since C is L, as clock signal is input, the operand input switch $S_{22}$ is triggered, so that the race line $RL_2$ becomes H first of all. Accordingly, the output of the WTA circuit 300, OUT becomes H regardless of values of D and E.

(4) A and B are L and C and D are H

Since values of A, B and C do not affect on the output of the WTA circuit 300, the race line $RL_1$ becomes H first of all by a triggering of the operand input switch $S_{12}$. Accordingly, the output of the WTA circuit 300, OUT becomes H regardless of value of E.

(5) A, B and D are L and C and E are high

Since values of A, B, C and D do not affect on the output, the race line $RL_1$ becomes H first of all by a triggering of the operand input switch $S_{13}$. Accordingly, the output of the WTA circuit 300, OUT becomes H.

(6) A, B, D and E are L and C is high

In case that all inputs are L, the operand input switch $S_{23}$ is triggered, so that the race line $RL_2$ becomes H. Accordingly, the output of the WTA circuit 300, OUT becomes L.

From the above cases of (1) to (5), it is shown that output values of the logic operation OUT=$\overline{A}\{B+C(D+E)\}$ can be obtained.

It is also known that the logic operation of the race logic in accordance with the present invention is performed not through transistors but through race lines. Further, since the logic operation uses a difference in arrival time when the operand signals arrive at the WTA circuit 300, it actively utilizes the time delay generated in the interconnection lines.

Figure 5A:
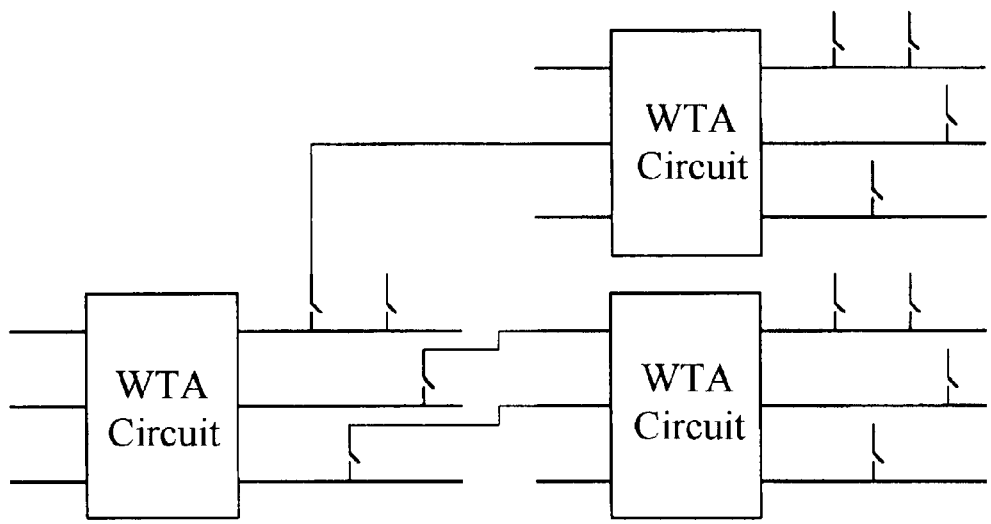
FIG. 5a and FIG. 5b show examples of circuits that can be made using the race logic of the present invention.
Figure 5B:
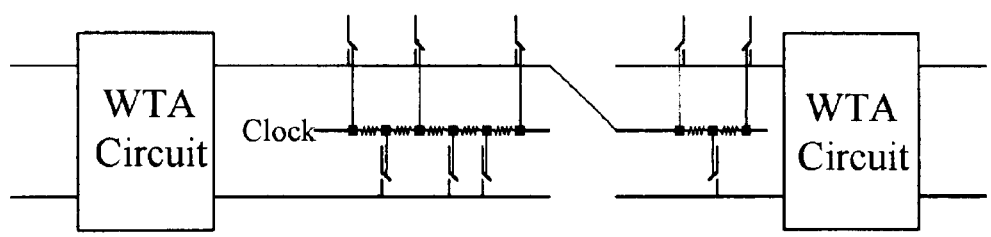

The race logic in accordance with the present invention can compose logic circuits through various kinds of connections. FIG. 5a and FIG. 5b show examples of circuits that can be made using the race logic of the present invention.

As shown in FIG. 5a, the output of the WTA circuit can be used as input of other race logic circuit and as shown in FIG. 5b, a part of the race line can compose the CDL of other race logic circuit.

A systematic method can be applied to the constitution of the race logic circuit whose race line is composed of the true line and the false line. If a relation between two operands is logic product (or AND operation), there are two methods. One (first method) is that the two operands are all connected to the false line and the other (second method) is that the first operand is connected to the false line and the second operand is connected to the true line.

If a relation between two operands is logic sum (or OR operation), there are also two methods. One (third method) is that the two operands are all connected to the true line and the other (fourth method) is that the first operand is connected to the true line and the second operand is connected to the false line. <New Line>

At this time, the operand connected to the false line should input an inverted value.
<New Line>

Unlike OR operation, the AND operation creates parenthesis, so that subsequent operands are positioned within the created parenthesis. In this case, there is needed a function for escaping from the parenthesis.

Figure 6A:
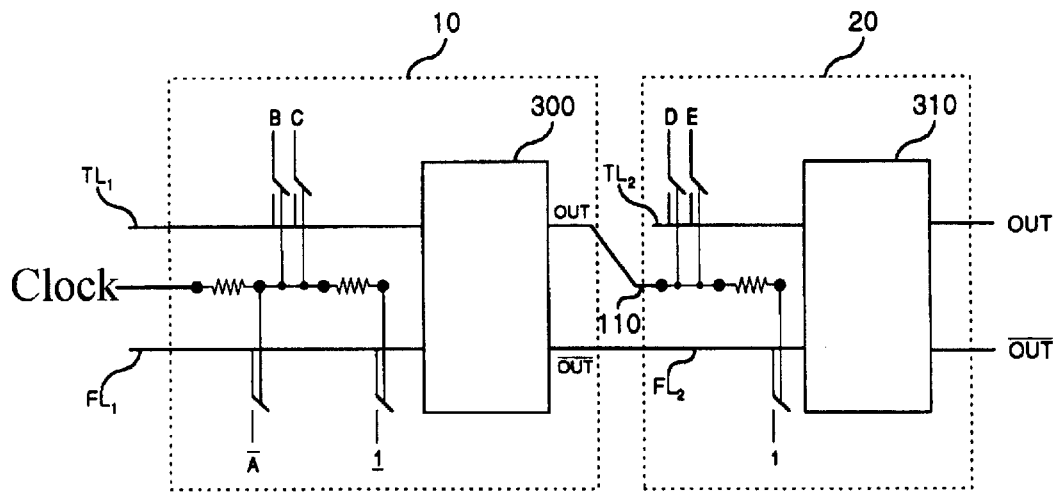
FIG. 6a and FIG. 6b show circuit diagrams for describing a function for escaping from the parenthesis.
Figure 6B:
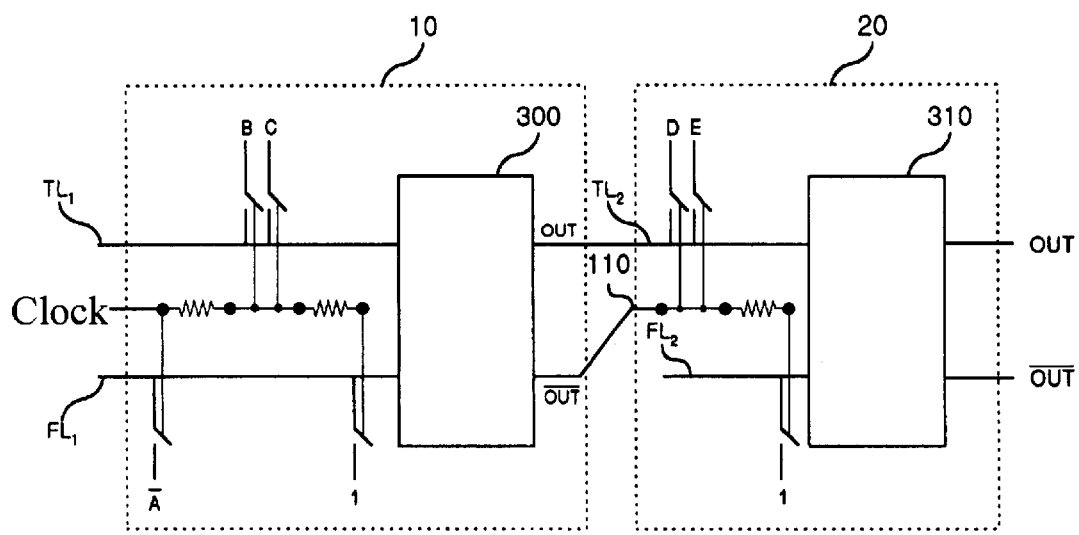

FIG. 6a and FIG. 6b show circuit diagrams for describing a function for escaping from the parenthesis.

Referring to FIG. 6a, in order to escape from the parenthesis during AND operation, OUT of the WTA circuit 300 of a race logic circuit 10 is connected to CDL 110 of another race logic circuit 20 and $\overline{OUT}$ is connected to the false line FL2 of the another race logic circuit 20.

The race logic circuit 10 performs an operation of A·(B+C) and the race logic circuit 20 performs an operation of (D+E), so that an operation of A(B+C)·(D+E) is performed as a whole, thereby realizing AND operation escaping from the parenthesis.

Referring to FIG. 6b, in order to escape from the parenthesis during OR operation, $\overline{OUT}$ of the WTA circuit 300 of the race logic circuit 10 is connected to the CDL 110 of the another race logic circuit 20 and OUT is connected to the true line $TL_2$ of the another race logic circuit 20.

The race logic circuit 10 performs an operation of A·(B+C) and the race logic circuit 20 performs an operation of (D+E), so that an operation of A(B+C)+(D+E) is performed as a whole, thereby realizing OR operation escaping from the parenthesis.

FIG. 7(a) through FIG. 7(h) are circuit diagrams for describing a composition method of a race logic for performing an operation of OUT=A(B+C+$\overline{D}$·E)+F·G(H+I).

Figure 7:
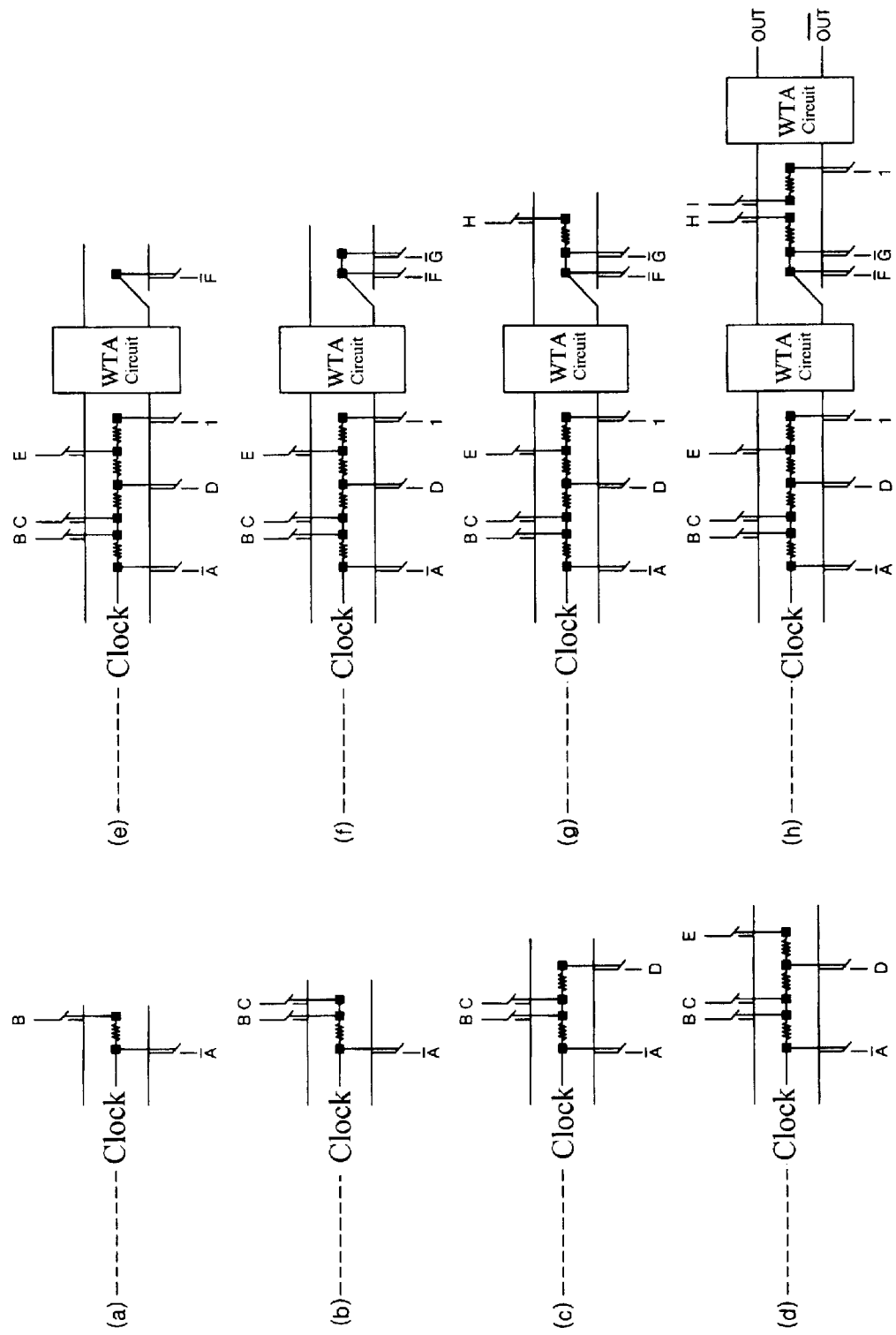
FIG. 7A through FIG. 7H are circuit diagrams for describing a composition method of a race logic for performing an operation of OUT=$A(B+C+\overline{D}\cdot E)+F \cdot G(H+I)$.

Since a relation between the operands A and B is AND operation, an inverted value of the operand A is connected to the false line and the operand B is connected to the true line as shown in FIG. 7(a).

Since a relation between the operands B and C is OR operation, the operand C is connected to the true line as shown in FIG. 7(b).

In case of connecting A and B, since the relation between them is AND operation, the operands A and B can be connected to the false line but since the operand B should be necessarily connected to the true line to realize OR operation between the operands B and C, there is used a method that the operand A is connected to the false line and the operand B is connected to the true line.

After that, the operands D and E are connected in the order named as shown in FIG. 7(c) and FIG. 7(d). The operand F should perform OR operation with escaping the parenthesis. So, as shown in FIG. 7E, termination and the WTA circuit 300 are connected in the order named and $\overline{OUT}$ of the WTA circuit 300 is connected to the CDL 110.

The operands F, G, H and I are connected in the order named as shown in FIG. 7(e) to FIG. 7(h).

By using the aforementioned method, it is possible to realize a circuit for performing any logic operation as a race logic circuit including two race lines and WTA circuit.

INDUSTRIAL APPLICABILITY

As described previously, the race logic of the present invention is a logic operation circuit and makes it possible to compose various logic circuits using a race logic algorithm. Especially, when realizing the race logic circuit as integrated circuits, a difference in time when operands arrive at the WTA circuit is utilized instead of transistors, so that time delay due to the transistors can be removed. Further, time delay in the interconnection lines is actively utilized to enhance the utilization of timing budget of circuit systems. Furthermore, the number of used transistors decreases considerably, so that it is possible to realize a logic circuit operated under very low power consumption and to decrease an area occupied on an IC.

What is claimed is:

1. A race logic circuit, comprising:

a WTA circuit for receiving an operand logic signal and outputting only a high signal which is the first to arrive among the operand logic signals;

multiple race lines for inputting the operand logic signal into the WTA circuit;

a clock distribution line having multiple delay devices connected in series, both ends of the respective delay devices being connected to a triggering line, the clock distribution line receiving an external clock and outputting a triggering signal into the triggering line; and multiple operand logic signal input switches which are triggered by the triggering signal output from the triggering line, for deciding whether to input the operand logic signal into the race line.

* * * * *

UNITED STATES PATENT AND TRADEMARK OFFICE
CERTIFICATE OF CORRECTION

| | |
|---|---|
| PATENT NO. | : 6,661,256 B2 |
| DATED | : December 9, 2003 |
| INVENTOR(S) | : Yoo et al. |

It is certified that error appears in the above-identified patent and that said Letters Patent is hereby corrected as shown below:

<u>Title page,</u>
Item [30], Foreign Application Priority Data, should read
-- Dec. 27, 2000 (KR) …………………...2000-82707 --.

Signed and Sealed this

Twenty-ninth Day of June, 2004

JON W. DUDAS
*Acting Director of the United States Patent and Trademark Office*